United States Patent [19]

Schneider

[11] 4,172,272
[45] Oct. 23, 1979

[54] SOLID STATE RELAY HAVING U-SHAPED CONDUCTIVE HEAT SINK FRAME

[75] Inventor: Stanley Schneider, Newport Beach, Calif.

[73] Assignee: International Rectifier Corporation, Los Angeles, Calif.

[21] Appl. No.: 901,698

[22] Filed: May 1, 1978

[51] Int. Cl.² ............................................. H05K 7/20
[52] U.S. Cl. ............................ 361/386; 174/52 PE; 174/16 HS
[58] Field of Search ............... 307/112, 139, 140, 203, 307/252 B, 252 UA; 174/16 HS, 52 PE; 361/331, 380, 392, 395, 426, 386–389; 340/644, 654; 362/800, 802; 357/72, 74

[56] References Cited
U.S. PATENT DOCUMENTS

| 3,209,218 | 9/1965 | Zielasek | 174/16 HS |
| 3,257,621 | 6/1966 | Jadoul | 174/16 HS |
| 3,501,582 | 3/1970 | Heidler | 174/52 PE |
| 3,723,769 | 3/1973 | Collins | 307/252 UA |
| 3,852,643 | 12/1974 | Seki | 174/16 HS |
| 4,007,378 | 2/1977 | Lazzara | 307/203 |
| 4,069,498 | 1/1978 | Joshi | 174/16 HS |
| 4,095,213 | 6/1978 | Hayden | 340/644 |

Primary Examiner—Gerald P. Tolin
Attorney, Agent, or Firm—Ostrolenk, Faber, Gerb & Soffen

[57] ABSTRACT

A novel solid state relay package has a U-shaped metallic frame which defines three surfaces of the general rectangular relay package. The open end of the U receives a circuit board containing most of the relay components. The interior of the frame is then filled with a solid plastic insulation material and terminal pins extending from the terminal board pass through the bottom of the solid plastic material to be accessible for external contact. The top of the housing receives a second terminal assembly for receiving power terminals connected to the main relay switching device and an LED indicator which is visible through the conductive U-shaped frame to indicate whether the relay is open or closed.

11 Claims, 9 Drawing Figures

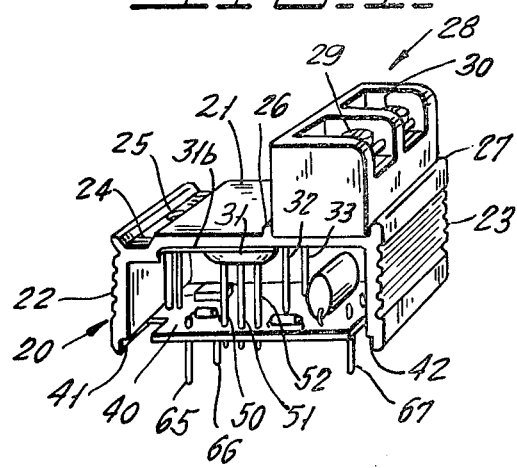
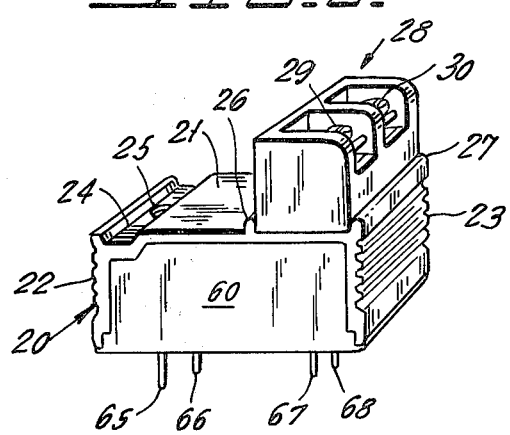
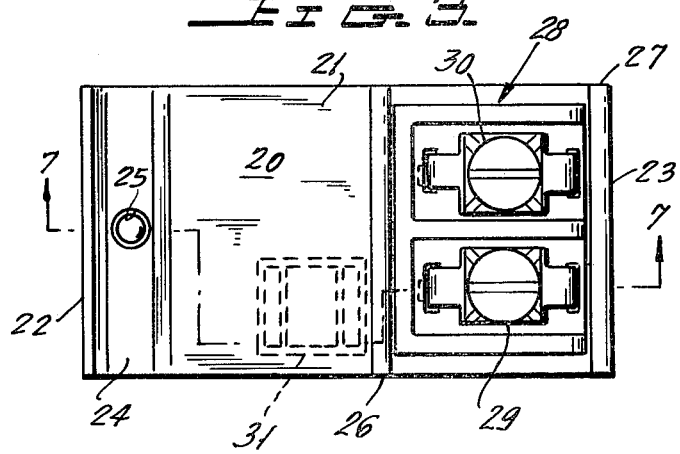
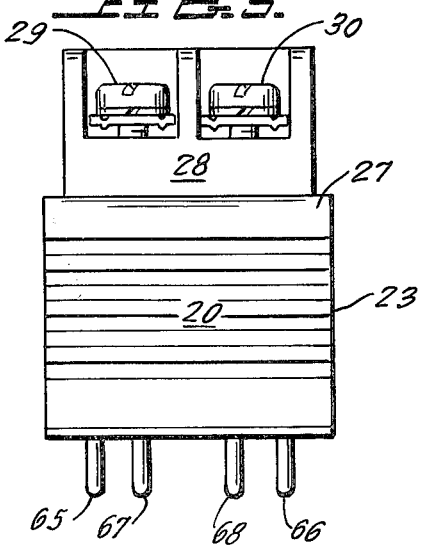
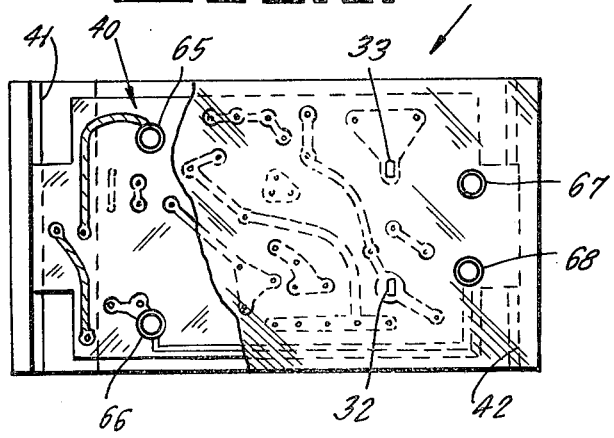
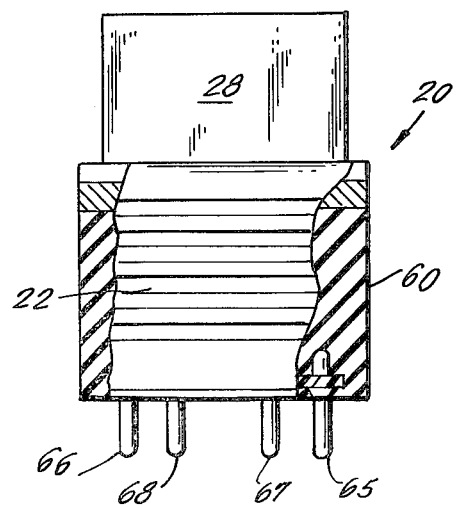

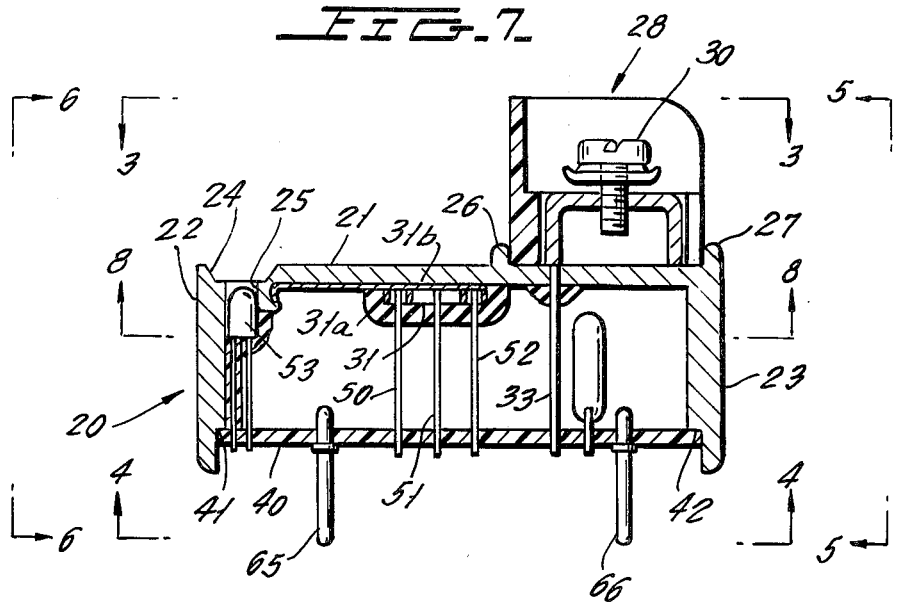
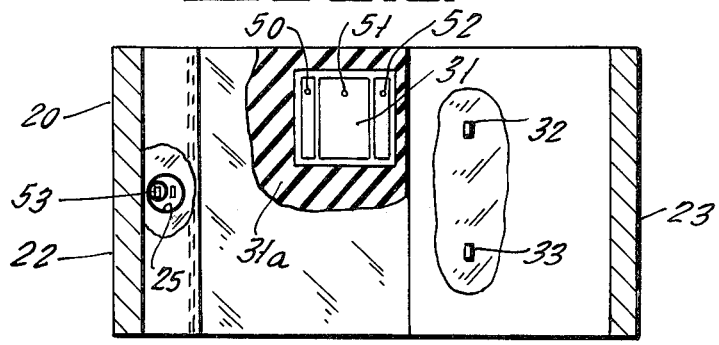
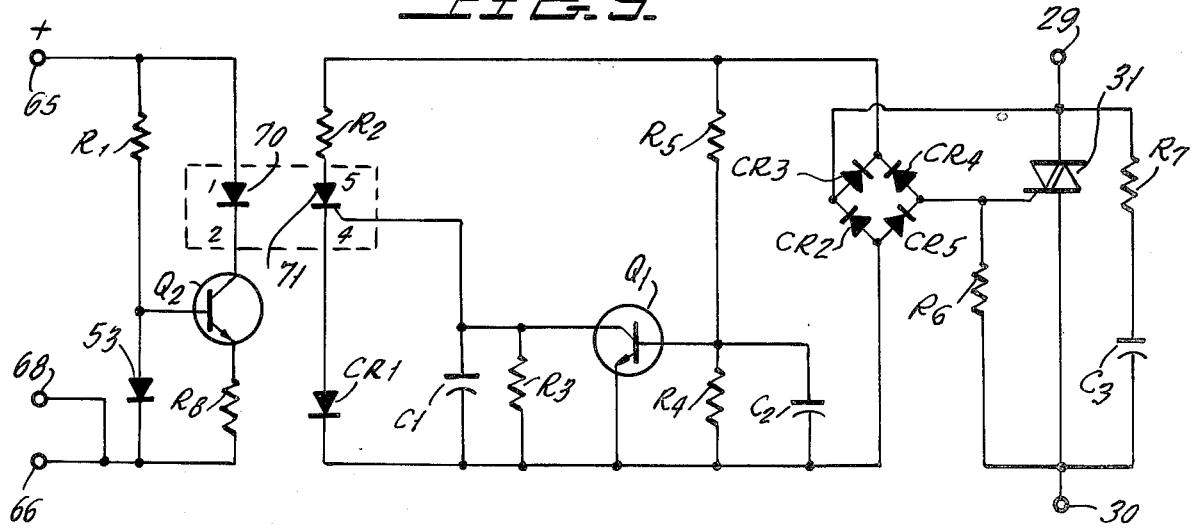

4,172,272

SOLID STATE RELAY HAVING U-SHAPED CONDUCTIVE HEAT SINK FRAME

BACKGROUND OF THE INVENTION

This invention relates to solid state relays, and more particularly relates to a novel housing arrangement for solid state relays which substantially increases the current carrying capacity of the relay.

Solid state relays are well known. A commonly used circuit for solid state relays is shown in U.S. Pat. No. 3,723,769 in the name of Collins entitled "Solid State Relay Circuit With Optical Isolation And Zero-Cross-Firing" dated Mar. 27, 1973. Such devices commonly use a semiconductor switching device such as a triac or a pair of reversely poled thyristors which can be switched into conduction by a control signal. These semiconductor switching devices are commonly mounted on a heat conductive ceramic which is suspended in an insulation mass which forms the housing of the device.

It has been difficult in the past to remove heat from the main switching device in as effective a manner as possible so that the current capacity of the device had to be limited. The present invention provides a novel arrangement whereby the current rating of a given circuit arrangement can be substantially uprated.

BRIEF DESCRIPTION OF THE PRESENT INVENTION

In accordance with the present invention, a novel housing arrangement is provided for a solid state relay wherein the housing consists of a generally U-shaped metallic bracket which can be an extruded aluminum member or the like, which bracket forms three surfaces of a rectangular housing. The open end of the U is then closed by a circuit board which carries the bulk of the control components of the solid state relay. The main switching device of the relay is then mounted directly on the interior surface of the U-shaped metallic housing. Thus, an extremely large effective heat sink is formed for the main switching device.

The entire interior of the U-shaped housing is then filled with a suitable and conventional insulation potting compound with suitable terminals extending from the printed circuit board through the potting compound for making connection to the input control circuits. A main pair of terminals connected to the main switching device are electrically connected to the switching device and are accessible at the top of the conductive U-shaped housing.

It has been found that the novel housing arrangement of the present arrangement has permitted the doubling of the current rating of a given relay circuit. Thus the same relay circuit which has been operated at one ampere at 70° C. in the past can now be operated at two amperes at 70°. Moreover, the novel housing arrangement of the invention substantially simplifies manufacturing techniques since the U-shaped housing serves as a frame for carrying all of the relay components, thus substantially simplifying assembly and potting of the housing.

BRIEF DESCRIPTION OF THE DRAWINGS

FIG. 1 is a perspective view of the relay housing of the present invention before potting.

FIG. 2 is a perspective view similar to FIG. 1 and shows the housing after potting.

FIG. 3 is a top view of the housing of FIGS. 1 and 2.

FIG. 4 is a bottom view of the housings of FIGS. 1 and 2.

FIG. 5 is an end view of the right-hand end of the housing of FIGS. 1 and 2.

FIG. 6 is an end view of the left-hand end of the housing of FIGS. 1 and 2.

FIG. 7 is a cross-sectional view of FIG. 3 taken across the section line 7—7 in FIG. 3.

FIG. 8 is a cross-sectional view of FIG. 7 taken across the section line 8—8 in FIG. 7.

FIG. 9 is a circuit diagram of a relay circuit which can be used in the relay assembly or housing of FIGS. 1 to 8.

DETAILED DESCRIPTION OF THE DRAWINGS

FIGS. 1 to 8 illustrate the novel housing assembly of the invention wherein the main body of the housing is formed by the generally U-shaped metallic heat sink 20 which defines three side surfaces of the generally rectangularly shaped housing. Heat sink 20 contains an upper generally flat surface 21 and an integral pair of end surfaces 22 and 23 where the end surfaces 22 and 23 may have thin sections extruded therein to increase the surface area of the end sections and thus their ability to transmit heat to the external atmosphere.

The upper section 21 contains a depression region 24 which has an opening 25 therein which will be later described as receiving an LED indicating lamp which indicates the one or off condition of the relay circuit. The upper section 21 is also provided with a pair of integral ridges 26 and 27 which locate a power terminal housing 28 which is an insulation body containing two conductive terminals 29 and 30 of the main circuit which is to be controlled by the relay.

In a typical example of the invention, the U-shaped housing 20 of metallic material may be about 1¾ inches long and about ¾ inches in height and about 1 inch in depth. Clearly other dimensions could be used as desired.

The solid state relay circuit which is to be housed includes a main semiconductor switching device such as a triac or a pair of controlled rectifiers or the like. This switching device is illustrated as a triac in the present invention wherein the triac device is carried on a conductive ceramic base in the manner illustrated, for example, in copending application Ser. No. 778,844, filed Mar. 18, 1977 entitled "Planar Lead Frame Construction For Solid State Relay". This type of triac device is schematically illustrated as the triac assembly 31 in FIGS. 1, 3, 7, 8 and 9.

Triac assembly 31 is then fixed to the interior bottom opposite surface 21 as by cementing or soldering. It may be useful to apply copper plating 31b to the interior of the aluminum housing 20 to improve the thermal connection to device 31 if soldering is used. A silastic mass 31a then encapsulates device 31 as shown.

The terminal assembly 28 is held in position on the U-shaped metallic frame through its extending terminal leads 32 and 33 (FIGS. 1, 4 and 7) which extend from terminals 29 and 30 respectively, and which are fixed to a circuit board 40 which extend across the open bottom of the U-shaped frame 20. Thus it will be noted that end sections 22 and 23 of frame 20 contain shoulders 41 and 42 and that the circuit board ends sit against these shoulders. Conductors 32 and 33 extend through the circuit board and are fixed thereto so that the circuit board and the terminal assembly 28 are each held secured with respect to the metal frame 20.

The circuit board 40 contains the bulk of the electronics which is required for the control of the main semiconductor switching device 31. These components are schematically illustrated in FIG. 9 which shall later be described in detail to give one example of the kind of relay circuit that can be used with the novel housing of the invention.

After the components are suitably wired and appropriate interconnections are made to the three leads 50, 51 and 52 from the triac 31 to the circuit board 40 and after suitable electrical connection is made from the LED device 53 located in opening 25 and the circuit board 40, the housing is potted with a suitable insulation medium shown as the potted medium 60 in FIG. 2. This potting compound completely fills the assembly and protects all of the electrical components contained within the boundaries of the U-shaped metallic housing 20. Four terminals or terminal pins 65, 66, 67 and 68 extend from the bottom of the printed circuit board 40 and through the potting medium which covers the bottom of the printed circuit board.

FIG. 9 shows a circuit diagram of a typical circuit which can be used in connection with the printed circuit board of FIGS. 1 to 8 and with the switching semiconductor of FIGS. 1 to 8 which is in the form of the triac 31.

In FIG. 9, terminals 66 and 68 are connected to the same essential point and the terminal 65 is connected to a source of control voltage which may be used to operate the relay. Terminal 67 of FIGS. 1 to 8 is an unused terminal in the circuit of FIG. 9. The input circuit in FIG. 9 consists of resistor R1 connected in series with the LED device 53 along with a second LED device 70 which is connected in series with the collector-emitter circuit of transistor Q2 and the resistor R8.

LED device 70 is optically coupled to an input light-sensitive controlled rectifier 71 which is a pilot device which causes the turn-on of the main triac 31 under suitable conditions. The purpose of the transistor Q2 is to ensure proper division of current between the LED 53 and the LED 70 when a control signal is present. Note that the presence of a control signal at terminal 65 will cause the turn-on of the relay circuit (as soon as there is an instantaneous voltage near zero) and the LED 53 serves as an indicator that a control signal for turning the relay on is present.

The pilot controlled rectifier 71 which is optically coupled to the input circuit previously described is connected in series with a resistor R2 and a diode CR1. The gate circuit of the light-sensitive controlled rectifier 71 is connected to the collector of transistor Q1 and is further connected to capacitor C1 and resistor R3 as illustrated which form a zero cross-firing circuit which will enable the firing or closing of the relay only in a low instantaneous power voltage interval.

The base of transistor Q1 is connected at the midpoint of a voltage divider consisting of resistors R4 and R5 and a capacitor C2 is connected in parallel with resistor R4. An input source of power for the component including controlled rectifier 71 and transistor Q1 is taken from a single phase bridge-connected rectifier consisting of the diodes CR2 through CR5 and this bridge circuit then has one terminal connected to the main a-c terminal 29 and its other terminal connected to the a-c terminal 30 through the resistor R6. The latter a-c terminal of the single phase bridge-connected rectifier is also connected to the gate lead of triac 31 while the main electrodes of triac 31 are connected to main terminals 29 and 30, respectively. Resistor R7 and series-connected capacitor C3 are also connected across the main terminals of the triac 31.

In operation, and assuming that a load is connected in series with terminals 29 and 30 and that an a-c voltage is applied to these terminals, so long as the triac is off, no current flows to the load. When, however, the triac is triggered into conduction, current can flow to the load.

D-C power is normally applied to the circuit components through the bridge consisting of diodes CR2 through CR5 so that, if a firing signal is applied to terminal 65, the LED 70 will be excited and its light output will be applied to the light-sensitive controlled rectifier 71. Assuming that an appropriate signal is also applied to the gate of controlled rectifier 71, the controlled rectifier 71 will fire so that control current will flow through controlled rectifier 71 and the diode CR1 and into the gate of the triac 31 through the bridge element CR5. The triac 31 will then be fired into conduction so that the relay is, in effect, closed. Note that the LED 53 is also turned on to give an external indication that the relay has been closed.

Transistor Q1 prevents the firing of the triac 31 until the instantaneous a-c voltage across the triac is below some minimum value. This eliminates or substantially decreases radio interference caused by the operation of the relay. The transistor Q1 is an essential element in this zero-cross-firing circuit and its control circuit is such that the transistor is turned off when the voltage between terminals 29 and 30 is less than about 15 volts. It is only when transistor Q1 is off that the controlled rectifier 71 can be fired by an application of an optical output signal from LED 70. Thus once an optical output signal appears from LED 70, the circuit will wait until the instanteous voltage across the triac 31 has reduced to below about 15 volts or whatever other value is designed into the circuit.

A satisfactory circuit has been obtained using the following component values for the components of FIG. 9.

| | |
|---|---|
| R1 | 1.1k |
| R2 | 47 ohms |
| R3 | 470k |
| R4 | 22k |
| R5 | 470k |
| R6 | 22 ohms |
| R7 | 47 ohms |
| R8 | 91 ohms |
| C1 | 100 picofarads. 25 volts |
| C2 | 4.70 picofarads, 50 volts |
| C3 | 0.047 microfarads, 400 volts |
| Transistors Q1 and Q2 | type 2N3565 |
| Triac 31 | type 3000-1256 |
| Diode CR1 | type 1N4148 |
| Diode CR2, 3, 4 and 5 | type 10D6 |
| LED 53 | type 3100-1493 |
| LED 70 and Light Sensitive Controlled Rectifier 71 | type 2500-1006 |

Although the present invention has been described in connection with a preferred embodiment thereof, many variations and modifications will now become apparent to those skilled in the art. It is preferred, therefore, that the present invention be limited not by the specific disclosure herein, but only by the appended claims.

I claim:

1. A housing enclosing a solid state relay circuit; said solid state relay circuit containing a semiconductor switching device and a control circuit thereof; said housing comprising a generally U-shaped metallic member having a central body and two spaced and parallel integral leg members and a thin printed circuit board containing at least a portion of said control circuit extending across the open end of said U-shaped metallic member and secured adjacent to the ends of said two integral leg members; said semiconductor switching device being soldered to the interior surface of said central body of said U-shaped metallic member and being in heat-conductive relation thereto; and electrical insulating material completely enclosing and at least partially filling the open volume defined between the two ends of said U-shaped metallic member.

2. The housing of claim 1 wherein said electrical insulating material consists of a potting material which completely fills said volume.

3. The housing of claim 1 which includes control circuit terminals extending from said circuit board through said insulating material and through said U-shaped metallic member to be externally accessible for connection of said control circuit.

4. The housing of claim 1 which further includes power circuit terminals supported on the outer surface of said central body and electrically connected to said semiconductor switching device.

5. The housing of claim 4 which includes conductors extending from said power circuit terminals to said printed circuit board and securing said printed circuit board to said ends of said two integral leg members.

6. The housing of claim 1 wherein the outer surface of each of said two integral leg members is formed with area-enlarging fins.

7. The housing of claim 1, wherein said integral leg members have respective interior shoulders at the ends of said leg members; said printed circuit board ends being received and supported on said shoulders.

8. The housing of claim 7 which includes power circuit terminals supported on the outer surface of said central body and electrically connected to said semiconductor switching device; and further including conductors extending from said power circuit terminals to said printed circuit board and securing said printed circuit board to said ends of said two integral leg members.

9. The housing of claim 8 wherein said electrical insulating material consists of a potting material which completely fills said open volume.

10. The housing of claim 1 which further includes an opening in said central body and an indicating lamp disposed in said opening; said indicating lamp being connected to said control circuit and indicating the energized condition of said solid state relay circuit.

11. The housing of claim 1, wherein said insulating material enclosing said open volume defines external surfaces enclosing said open volume; said surfaces, together with said generally U-shaped metallic member and with said circuit board, defining generally a parallelipiped.

* * * * *